(12) United States Patent
Protzman

(10) Patent No.: US 6,330,196 B1
(45) Date of Patent: Dec. 11, 2001

(54) CIRCUIT AND METHOD FOR A HIGH DATA TRANSFER RATE OUTPUT DRIVER

(75) Inventor: Brendan N. Protzman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/517,814

(22) Filed: Mar. 2, 2000

Related U.S. Application Data

(63) Continuation of application No. 09/259,228, filed on Mar. 1, 1999.

(51) Int. Cl.⁷ ................................................ G11C 7/00
(52) U.S. Cl. .............................. 365/189.11; 365/189.05; 365/203; 326/88
(58) Field of Search .................... 365/189.05, 189.11, 365/203, 226; 326/83; 227/589

(56) References Cited

U.S. PATENT DOCUMENTS

| | | | |
|---|---|---|---|
| 5,241,502 | 8/1993 | Lee et al. ........................... | 365/203 |
| 5,329,186 | 7/1994 | Hush et al. ......................... | 307/482 |
| 5,396,463 | 3/1995 | Kim et al. ...................... | 365/189.11 |
| 5,450,356 | 9/1995 | Miller ............................. | 365/189.05 |
| 5,469,385 * | 11/1995 | Smith et al. .................... | 365/189.05 |
| 5,483,179 | 1/1996 | Dhong et al. ......................... | 326/88 |
| 5,559,452 * | 9/1996 | Saito ................................. | 326/88 |
| 5,594,380 | 1/1997 | Nam ................................ | 327/390 |
| 5,786,711 * | 7/1998 | Choi .................................. | 326/83 |
| 5,802,009 * | 9/1998 | Casper et al. .................. | 365/189.11 |
| 5,818,258 * | 10/1998 | Choi .................................. | 326/83 |
| 5,940,331 | 8/1999 | Kagami ......................... | 365/189.05 |
| 5,947,721 * | 9/1999 | Kwon et al. ................... | 365/189.11 |
| 6,072,729 * | 6/2000 | Casper .......................... | 365/189.05 |

* cited by examiner

*Primary Examiner*—Son T. Dinh
(74) *Attorney, Agent, or Firm*—Dorsey & Whitney LLP

(57) ABSTRACT

An output driver includes multiple boot circuits to drive a pull-up signal of a data driver. A control circuit selects a fully precharged boot circuit when the data output by the output driver is a high signal. The remaining boot circuits not selected are allowed to fully precharge during this time in preparation for a subsequent data high signal. Consequently, any precharge delay time can be masked by selecting a fully precharged boot circuit when driving a subsequent pull-up signal.

20 Claims, 6 Drawing Sheets

CIRCUIT AND METHOD FOR A HIGH DATA TRANSFER RATE OUTPUT DRIVER

CROSS-REFERENCE TO RELATED APPLICATION

This application is a continuation application of pending U.S. patent application Ser. No. 09/259,228, filed Mar. 1, 1999.

TECHNICAL FIELD

The invention relates generally to integrated circuit memory devices, and more particularly, to an apparatus and method for driving an output data signal at a high data transfer rate.

BACKGROUND OF THE INVENTION

Conventional computer systems include a processor coupled to a variety of memory devices, including read-only memories ("ROMs") that traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a packetized memory device known as a SLDRAM memory device. In the SLDRAM architecture, the system memory may be coupled to the processor, either directly through the processor bus or through a memory controller. Rather than requiring that separate address and control signals be provided to the system memory, SLDRAM memory devices receive command packets that include both control and address information. The SLDRAM memory device then outputs or receives data on a data bus that may be coupled directly to the data bus portion of the processor bus.

In order for system memory devices to provide data at data transfer rates comparable to the processing speed, the system memory devices require a data output buffer that can provide data at the required slew-rates and drive capabilities demanded by the computer system. Conventional data output buffers attempt to satisfy this demand with an output driver circuit having both NMOS pull-up and pull-down transistors. The advantages of using an NMOS pull-up transistor in an output driver, rather than a PMOS pull-up transistor, are smaller size, faster switching times, less susceptibility to latch-up, and greater resistance to damage caused by electrostatic discharge.

Shown in FIG. 1 is a conventional output driver circuit 10 having both an NMOS pull-up transistor and pull-down transistor. In operation, when the output driver 10 receives a high input data signal DR, an inverter 14 produces a low pull-down signal PD to switch OFF an NMOS pull-down transistor 16, and a conventional boot circuit 18 is activated to generate a high pull-up signal PU that turns ON an NMOS pull-up transistor 20. The NMOS pull-up transistor 20 couples an output terminal 24 to a supply terminal providing a VCCQ voltage in order to generate a high data output signal DQ. The boot circuit 18 is required to drive the gate terminal of the NMOS pull-up transistor 20 because unless the PU signal applied to the gate of the NMOS pull-up transistor 20 exceeds the VCCQ voltage by at least one threshold voltage of the NMOS pull-up transistor 20, the output level of the high DQ signal will be diminished by one threshold voltage of the NMOS pull-up transistor 20. When the output driver 10 receives a low DR signal, the boot circuit 18 is deactivated to turn OFF the NMOS pull-up transistor 20 and the inverter 14 produces a high PD signal to turn ON the NMOS pull-down transistor 16. The NMOS pull-down transistor 16 couples the output terminal 24 to a ground terminal in order to generate a low DQ signal.

A conventional boot circuit 50 shown in FIG. 2 may be used for the boot circuit 18 of FIG. 1. Prior to the DR signal going high, a boot-node 52 is precharged to a voltage (VCC−Vtc) by the diode connected charging transistor 54, where Vtc is the threshold voltage of the charging transistor 54. When the DR signal goes high, an inverter 56 turns ON a PMOS pass transistor 62 to couple the boot-node 52 to the gate of the NMOS pull-up transistor 20 (FIG. 1), and also turns OFF an NMOS discharging transistor 64. An inverter 58 drives one terminal of a capacitor 60 coupled to the boot-node 52, and thus, forces the boot-node 52 to a voltage in excess of the precharge voltage. The resulting voltage is used to drive the gate of the pull-up transistor 20.

When the DR signal goes low, the inverter 56 turns ON the discharging transistor 64 to couple the gate of the pull-up transistor 20 to ground. The inverter 56 also applies a voltage of VCC to the gate of the pass transistor 62 in an attempt to turn OFF the pass transistor 62 to isolate the boot-node 52. The inverter 58 then subsequently pulls the terminal of the capacitor 60, to which its output is coupled, to approximately ground and, in response, a corresponding decrease in the voltage of the boot-node 52 will occur. Consequently, the resulting voltage of the boot-node 52 may be pulled below the precharge voltage. However, just prior to the output of the inverter 58 switching to ground potential, the voltage at the boot-node 52 will be well above VCC+Vt, where Vt is the threshold voltage of the pass transistor 62. Thus, the pass transistor 62 will be on until the output of the inverter 58 switches to ground even though the inverter 56 applies a voltage of VCC to the gate of the pass transistor 62. The gate of the discharging transistor 64 also receives a voltage of VCC, thereby turning ON the transistor 64. Thus, both the pass transistor 62 and the discharging transistor 64 are ON during the time that the output of the inverter 58 is switching from high to low. As a result, the capacitor 60 is discharged through the transistors 62, 64 during this time. Although the diode connected charging transistor 54 will eventually charge the boot-node 52 to the precharge voltage, it will take a finite period of time to fully precharge the boot-node 52. In applications where output data must be provided faster than the minimum time required to fully precharge the boot-node 52, the precharge delay may limit the data transfer rate of the system memory devices.

The problems associated with precharge delay are most apparent when the output data sequence of the output driver 10 is 1-0-1, that is, the output driver 10 must generate a high output signal, followed by a low output signal, and then followed by another high output signal. With reference to FIG. 1, for the first high output signal, the boot circuit 18 provides a PU signal to drive the NMOS pull-up transistor 20, as described above. The pull-up transistor 20 is made conductive by the PU signal, and the output terminal 24 of the output driver 10 is coupled to the supply terminal to provide a high output signal. The output level of the high output signal will be equal to the VCCQ voltage.

In order for the output driver 10 to generate the subsequent low logic output, the boot circuit 18 is deactivated when the DR signal goes low and the pull-down transistor 16 is turned ON by the inverter 14. The output terminal 24 is coupled to a ground terminal to provide a low logic output. As previously described, when the boot circuit 50 (FIG. 2) is deactivated, the boot-node 52 may be pulled to below the precharge voltage, and require a finite period of time for the charging transistor 54 to fully precharge the boot-node 52.

Following the low output signal, the output driver 10 must generate another high logic output signal. The pull-down transistor 16 is switched OFF, and the pull-up transistor 20 must be switched ON by a PU signal having a sufficient voltage. However, the boot-node 52 may not have fully precharged from the previous low output signal. If the boot circuit 50 is activated before the boot-node 52 is fully precharged, the resulting PU signal may not have sufficient voltage to adequately drive the gate of the pull-up transistor 20. An insufficient PU signal may result in a high output signal having an output level deficient enough to cause memory errors in the computer system. Consequently, the maximum data transfer rate of a system memory device using a conventional output driver may be limited by the minimum precharge time of the boot circuit used in the output driver.

Therefore, there is a need for an output driver that can provide output data at a data transfer rate not limited by the precharge delay of an associated boot circuit. Although the foregoing discussion is directed to a need for improved output drivers used in output buffers of packetized DRAMs, similar problems exist in other memory devices, such as synchronous DRAMs, that must output data signals a high data transfer rate.

SUMMARY OF THE INVENTION

An apparatus and method for masking precharge time of an output driver circuit. A control circuit selects a fully precharged boot circuit to drive the pull-up signal for a data driver circuit when the data output by the output driver is a high signal. Non-selected boot circuits remain deactivated to allow full precharge in preparation for a subsequent high data output signal. The control circuit may also generate a pull-down signal when the data output by the output driver is a low signal, and a discharge signal to discharge a pull-up node to prevent a short-circuit to ground.

DETAILED DESCRIPTION OF THE INVENTION

Figure 3:
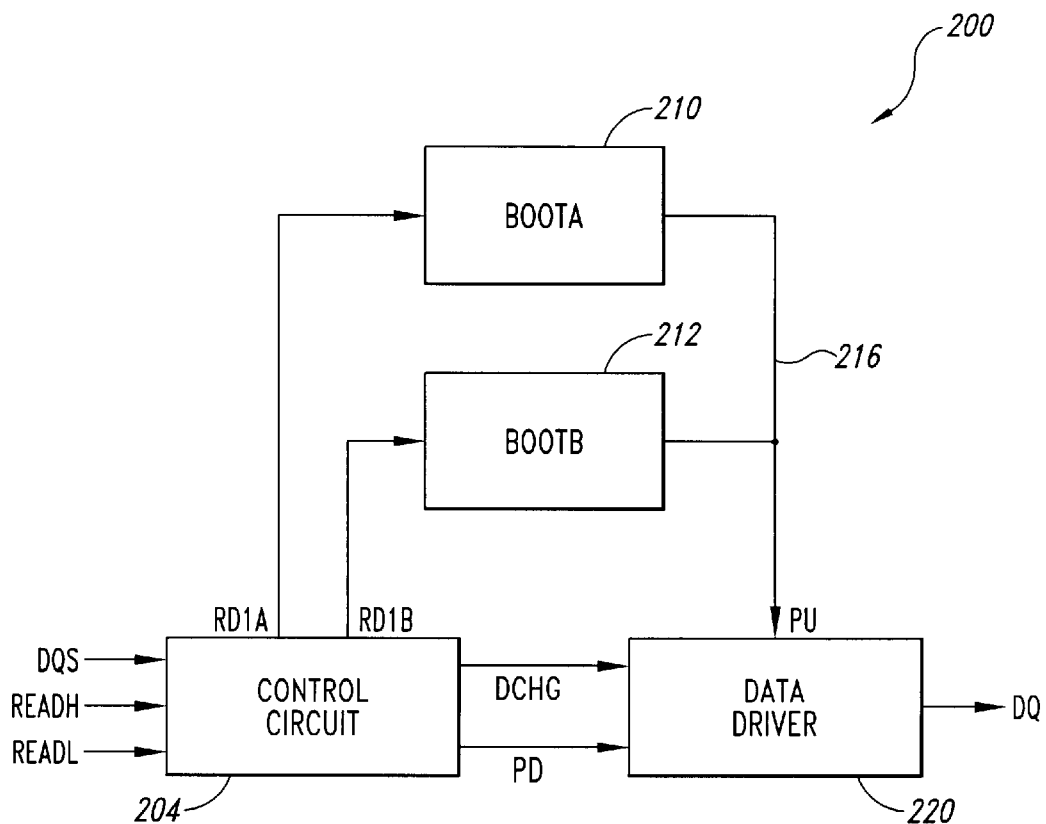
FIG. 3 is a block diagram of output driver circuit according to an embodiment of the invention.

An embodiment of an output driver 200, shown in FIG. 3, generates a data output signal DQ on both the rising and falling edges of the clock signal DQS. A control circuit 204 is coupled to receive a data signal READH on the rising edge of the DQS signal, and a data signal READL on the falling edge of the DQS signal. The control circuit 204 alternatively selects between two boot circuits 210, 212 to provide a pull-up signal PU to a data driver circuit 220 in order to mask any delay from precharging the boot circuits 210, 212. The boot circuit not selected by the control circuit can be precharged while the selected boot circuit is driving a pull-up node 216 with the PU signal. Upon receiving a subsequent high READH or READL signal, the control circuit 204 will select the precharged boot circuit to drive the pull-up node 216, and the boot circuit that had been formerly selected can be precharged in preparation for the next high READH or READL signal.

Figure 1:
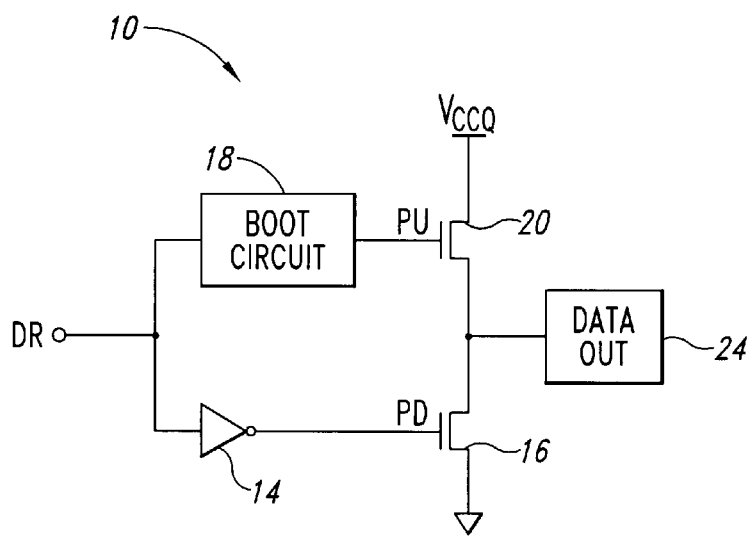
FIG. 1 is a schematic diagram of a conventional output driver circuit.
Figure 2:
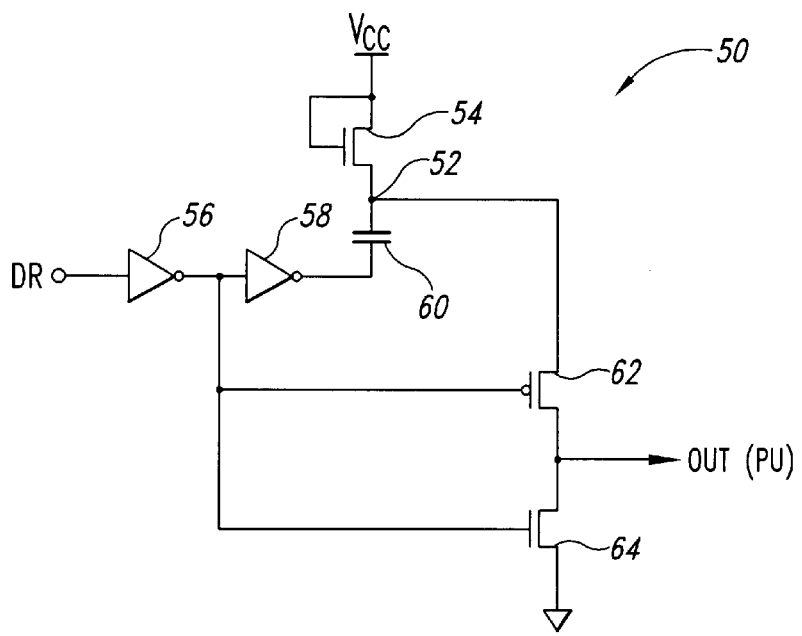
FIG. 2 is a schematic diagram of a conventional boot circuit used in the conventional output circuit of FIG. 1.

In order to illustrate the operation of the output driving circuit 200 (FIG. 2), the following example with reference to FIG. 2 will be used: READH is high on the rising edge of the DQS signal; READL is low on the falling edge of the DQS signal; and READH is high on the rising edge of the DQS signal. Detailed descriptions of the control circuit 204, the boot circuits 210, 212, and the data driver circuit 220 will follow the aforementioned example.

Initially, both boot circuits 210, 216 are fully precharged prior to the output driver circuit 200 generating a DQ signal corresponding to the READH or READL signals. Upon receiving the high READH signal on the rising edge of the DQS signal, the control circuit 204 generates an activation signal RD1A to activate the boot circuit 210. The activated boot circuit 210 generates a relatively high voltage PU signal on the pull-up node 216 in order for the data driver 220 to generate a DQ signal having a high logic level. As will be explained in greater detail below, the resulting high DQ signal will not be reduced by the threshold voltage of a pull-up transistor of the data driver 220 because the PU signal applied to the gate of the pull-up transistor exceeds the voltage of the supply terminal to which the pull-up transistor is coupled by more than one threshold voltage of the pull-up transistor.

When the control circuit 204 receives a low READL signal on the falling edge of the DQS signal, the control circuit 204 deactivates the boot circuit 210, and the boot circuit 210 then begins to precharge. The control circuit 204 further generates a pull-down signal PD in order for the data driver circuit 220 to generate a low DQ signal, and also generates a discharge signal DCHG to discharge the pull-up node 116 to prevent the pull-up transistor from inadvertently being switched on while the data driver circuit 220 is generating a low DQ signal.

On the following rising edge of the DQS signal, a high READH signal is coupled by the control circuit 204. In response, the control circuit 204 generates a RD1B signal to activate the boot circuit 212, that is, the boot circuit that was not selected during the previous high READH signal. The previously selected boot circuit 210 may not have precharged itself fully in the time between the prior rising edge of the DQS signal and the current rising edge of the DQS signal. If activated to drive the pull-up node 216 before being fully precharged, the previously selected boot circuit 210 would not be able to generate a PU signal having a sufficient voltage for the data driver 220 to produce an acceptably high DQ signal. However, the currently selected boot circuit 212 had been precharging during the time the previously selected boot circuit 210 was driving the pull-up node 216. Therefore, the currently selected boot circuit 212 is now fully precharged, and in response to the current high READH signal is ready to immediately drive the pull-up node 216 with a PU signal having a sufficient voltage. The resulting high DQ signal generated by the data driver circuit 220 will consequently have an acceptably high output level. While the currently selected boot circuit 212 is driving the pull-up node 216, the previously selected, or the currently not selected, boot circuit 210 is isolated from the pull-up node 216 and is able to fully precharge before a subsequent high READH or READL signal.

Figure 4:
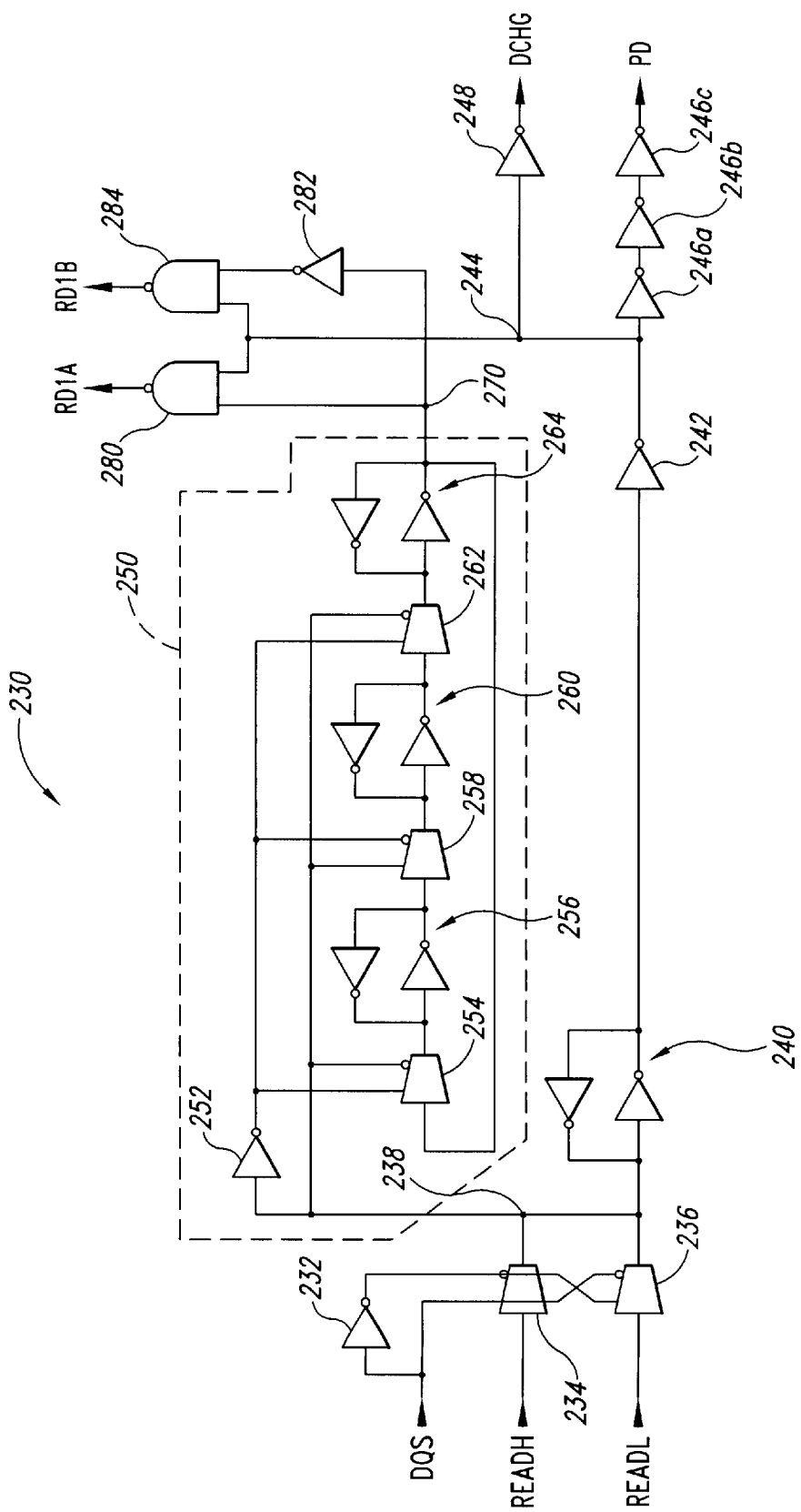
FIG. 4 is a schematic diagram of a control circuit of the output driver circuit shown in FIG. 3.

Illustrated in FIG. 4, is a control circuit 230 that can be used for the control circuit 204 shown in FIG. 3. The control circuit 230 will generate RD1A and RD1B signals to alternatively activate the boot circuits 210 and 212 when either the READH or READL signals are high. The DQS clock signal, and the DQS signal inverted by an inverter 232, are applied to the control terminals of pass gates 234 and 236.

The pass gate 234 couples the data signal READH to a data node 238 while the DQS clock signal is high, and the pass gate 236 couples the data signal READL to the same data node 238 while the DQS signal is low. A latch 240 latches the data coupled to the data node 238. The output of the latch 240 is coupled to a node 244 through an inverter 242. When either the READH or READL signals are low, the resulting PD signal generated at the output of three series coupled inverters 246a–c goes high to activate the data driver circuit 220 (FIG. 3) to generate a low DQ signal. A DCHG signal also goes high to discharge the pull-up node 216. As a person of ordinary skill will appreciate, the timing of the PD and DCHG signals with respect to the RD1A and RD1B should be such that the boot circuits are deactivated prior to the DCHG and PD signals activating the data driver 220 in order to prevent a short circuit to ground.

The data node 238 is also coupled to a toggling circuit 250. The toggling circuit 250 will generate an output signal at a node 270 that toggles whenever the data node changes from high to low. As will be explained below, the toggling output signal of the toggle circuit 250 is used to alternatively select between the boot circuits 210 and 212 whenever the READH or READL signals are high. The data node 238 is coupled directly, and through an inverter 252, to the control terminals of pass gates 254, 258, and 262. A latch 256 is coupled between the pass gates 254 and 258, and a latch 260 is coupled between the pass gates 258 and 260. A latch 264 is coupled to the output of the pass gate 264, and has an output coupled to the input of the pass gate 254, thus forming a feedback loop.

The pass gates 254 and 262 are activated when the data node 238 is low. During the time the pass gates are activated, latches 256 and 264 latch the data present at the input of the respective pass gates. The pass gate 258 remains deactivated until the data node 238 goes high, at which time both pass gates 254 and 262 are deactivated simultaneously, and the latch 260 latches data from the output of the latch 256. When the data node goes 238 low again, the pass gates 254 and 262 will be reactivated, and latch 264 will latch the data of latch 260. The output of the latch 264 will be inverted, or toggled if the data of latch 260 has changed. Consequently, the output toggle circuit 250 is toggled only when the node 238 changes from high to low. In the cases where the node 238 maintains a voltage level, or changes from low to high, the output generated by the toggle circuit 250 does not toggle because pass gates 254 and 262 are deactivated immediately prior to the latch 260 latching new data when the pass gate 258 is activated. The latch 264 does not latch the new data of latch 260 until the pass gate 262 is reactivated, that is, when the node 238 changes from high to low.

The output of the toggle circuit 250 is coupled at the node 270 directly to a NAND gate 280, and also through an inverter 282 to a NAND gate 284. Both the NAND gates 280 and 284 have a second input coupled to the node 244. The output of the NAND gate 280 provides the RD1A signal and the output of the NAND gate 284 provides the RD1B signal. The RD1A and RD1B signals are alternatively low to activate the respective boot circuit whenever the input of the NAND gate is set high by the toggle circuit 250, and the node 244 is high, that is, when either the READH or READL signals are high.

Figure 5:
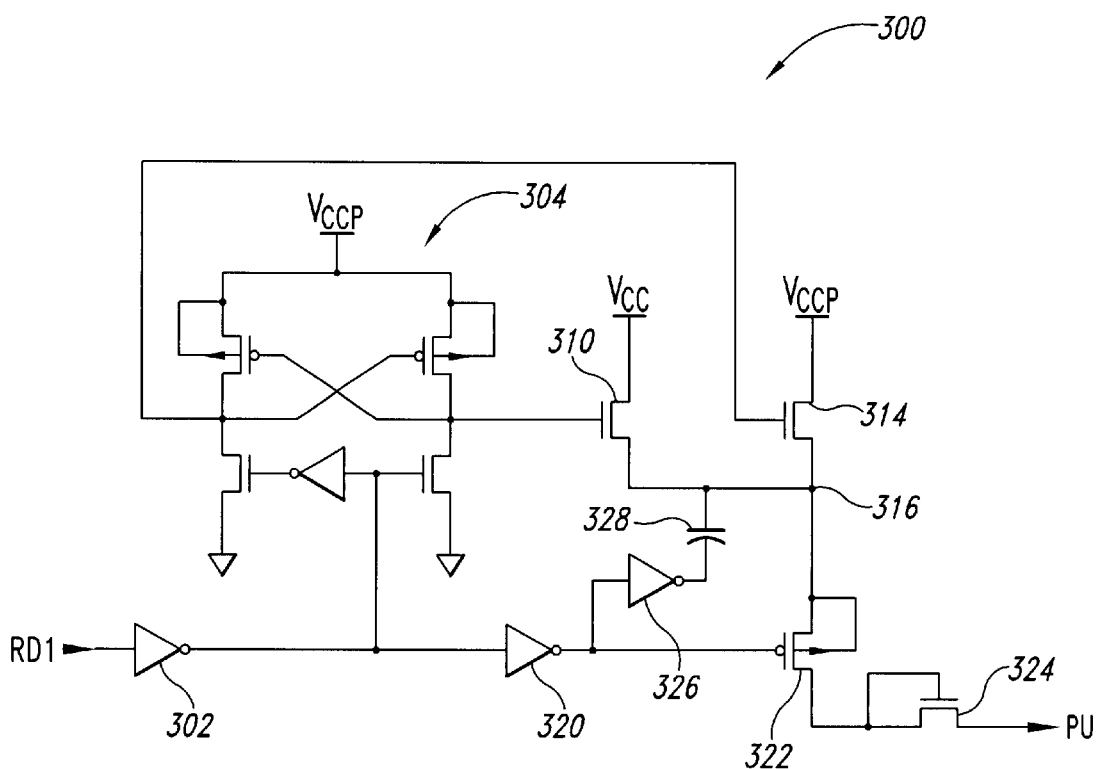
FIG. 5 is a schematic diagram of a boot circuit of the output driver circuit shown in FIG. 3.

Illustrated in FIG. 5 is an embodiment of a boot circuit 300 that may be used for the boot circuits 210 and 212 of the output driver circuit 200 of FIG. 3. When activated by the activation signal RD1 going low, the boot circuit 300 generates a PU signal having a voltage great enough to be used by the data driver 220 (FIG. 3) to generate a sufficiently high DQ signal.

The RD1 signal is provided to the input of a inverter 302. A toggle circuit 304 is toggled by the output signal of the inverter 302 to provide output signals that alternatively switch ON either a charging transistor 310 or a keeper transistor 314. The charging transistor 310 is coupled between a supply terminal providing a voltage VCC and a super voltage node 316. The charging transistor 310 is used to precharge the super voltage node 316 when the boot circuit 300 is not activated, that is, when the RD1 signal is high. During the time the boot circuit 300 is not activated, the toggle flip-flop 304 couples to the gate of the charging transistor 310 to a supply terminal providing a VCCP voltage. The VCCP voltage is a boosted voltage that exceeds the VCC voltage by at least one threshold voltage of the charging transistor 310. Therefore, while the gate of the charging transistor 310 is driven by the VCCP voltage, the super voltage node 316 will fully precharge to the VCC voltage.

When the boot circuit 300 is activated by the RD1 signal going low, the toggle flip-flop 304 turns OFF the charging transistor 310, and turns ON the keeper transistor 314 coupled between a supply terminal providing the VCCP voltage and the super voltage node 316. The keeper transistor 314 is switched ON by the toggle flip-flop 304 in order to keep the super voltage node 316 at a minimum voltage of (VCCP−Vtk), where Vtk is the threshold voltage of the keeper transistor 314.

Also in response to receiving the low RD1 signal, an inverter 320 turns ON a pass transistor 322 to couple the super voltage node 316, through a diode connected transistor 324, to the pull-up node 216 (FIG. 3). An inverter 326 inverts the output of the inverter 320, and raises the voltage on one terminal of a capacitor 328 coupled between the output of the inverter 326 and the super voltage node 316. The voltage on the one terminal of the capacitor 328 is increased by an amount approximately equal to the supply voltage VCC applied to the inverter 326, which is generally a voltage equal to the voltage swing of the RD1 signal. A corresponding increase will occur on an opposite terminal of the capacitor 328, and the super voltage node 316 will be driven to a voltage greater than the VCC voltage to which the super voltage node 316 was precharged. Consequently, the pull-up node 216 will also be driven to a similarly high voltage. The toggle circuit 304 also applies a high to the gate of the keeper transistor 314. The keeper transistor 314 then couples the capacitor 328 to a pumped supply voltage VCCP to maintain the charge on the capacitor 328. The pumped voltage VCCP is not used to supply the charging current for the capacitor 328 because the charging current can be more efficiently supplied by the supply voltage VCC.

The diode connected transistor 324, coupled between the pull-up node 216 and the pass transistor 322, will reduce the voltage of the PU signal generated by the boot circuit 300 by one threshold voltage of the transistor 324. However, the diode connected transistor 324 is necessary to isolate the boot circuit 300 when another boot circuit is driving the pull-up node 216 with a voltage exceeding the VCC voltage. Without the diode connected transistor 324, the PU signal generated by another boot circuit may drive the pull-up node 216 to a voltage great enough to render the pass transistor 322 conductive, resulting in the inactive boot circuit 300 appearing as a current drain on the pull-up node 216.

The boot circuit 300 is deactivated when the RD1 signal returns high. The PMOS pass transistor 322 is turned OFF to isolate the super voltage node 316, and the toggle flip-flop 304 is toggled to turn OFF the keeper transistor 314 and turn ON the charging transistor 310 to charge the capacitor 328.

Additionally, the terminal of the capacitor 328 coupled to the output of the inverter 326 is pulled down to approximately to ground when the RD1 signal goes high. Consequently, the super voltage node 316 will also be pulled down a corresponding voltage. The resulting voltage at the super voltage node 316 will depend on the voltage prior to the boot circuit 300 being deactivated. It is possible that immediately following the RD1 signal going high, the resulting voltage of the super voltage node 316 is below the VCC voltage. In the case where only one boot circuit 300 is used, the time it will take to fully precharge the super voltage node 316 to the VCC voltage may be unacceptably long. However, as previously described, the precharge delay of the boot circuit 300 may be masked by using the embodiment of the output driver 200 shown in FIG. 3.

Figure 6:
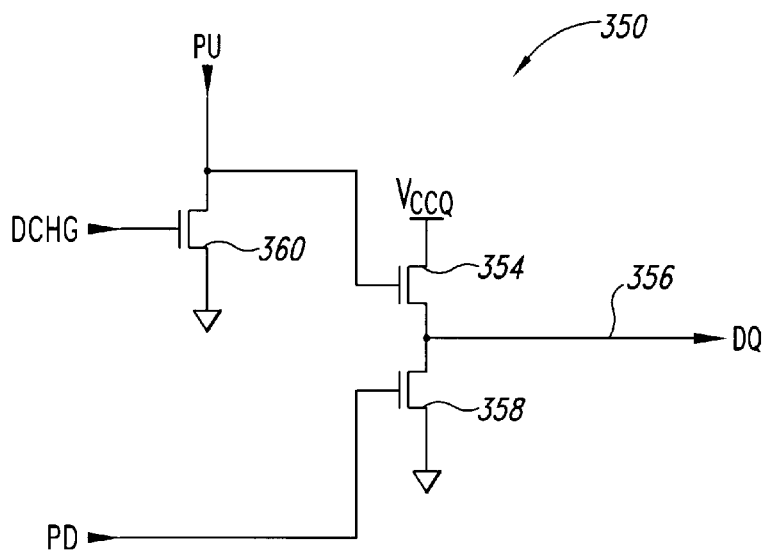
FIG. 6 is a schematic diagram of a data driver circuit of the output driver circuit shown in FIG. 3.

Illustrated in FIG. 6 is a data driver circuit 350 that may be used for the data driver circuit 220 of the output driver circuit 200 (FIG. 3). An NMOS pull-up transistor 354 couples a supply terminal providing a VCCQ voltage to an output terminal 356 upon receiving the PU signal at its gate terminal. As mentioned previously, the PU signal generated by either boot circuit 210 or 212 (FIG. 3) will have a voltage great enough so the threshold voltage of the transistor 354 does not diminish the output level of the DQ signal. Therefore, when the control circuit 204 receives either a high READH or READL signal, the output signal DQ will have an output level equal to the VCCQ voltage.

An NMOS pull-down transistor 358 couples the output terminal 356 to a ground terminal when the PD signal is applied to its gate terminal, thus producing a low DQ signal at the output terminal 356. In addition to receiving the PD signal from the control circuit 204 when either the READH or READL signals are low, the data driver circuit 350 also receives a discharge signal DCHG. A discharge transistor 360 has its gate coupled to receive the DCHG signal, and will discharge the pull-up node 216 when the data driver circuit 350 is generating a low DQ signal. The discharge transistor 360 provides a path to a ground terminal to dissipate any residual charge on the pull-up node 216. Completely discharging the pull-up node 216 ensures that the pull-up transistor 354 is not inadvertently switched ON at the same time as the pull-down transistor 358.

Although the discussion has so far focused on an embodiment of an output driver that can generate output data signals on both the rising and falling edges of a data clock signal, one ordinarily skilled in the art can appreciate that all or some of the principles discussed above is not limited to the aforementioned embodiment. For example, both an output driver that generates a data output signal on only one edge of a data clock signal, and an output driver that generates a data output signal in response to receiving a data signal, can use multiple boot circuits to ensure that the data transfer rate is not limited by the precharge delay associated with a single boot circuit.

Figure 7:
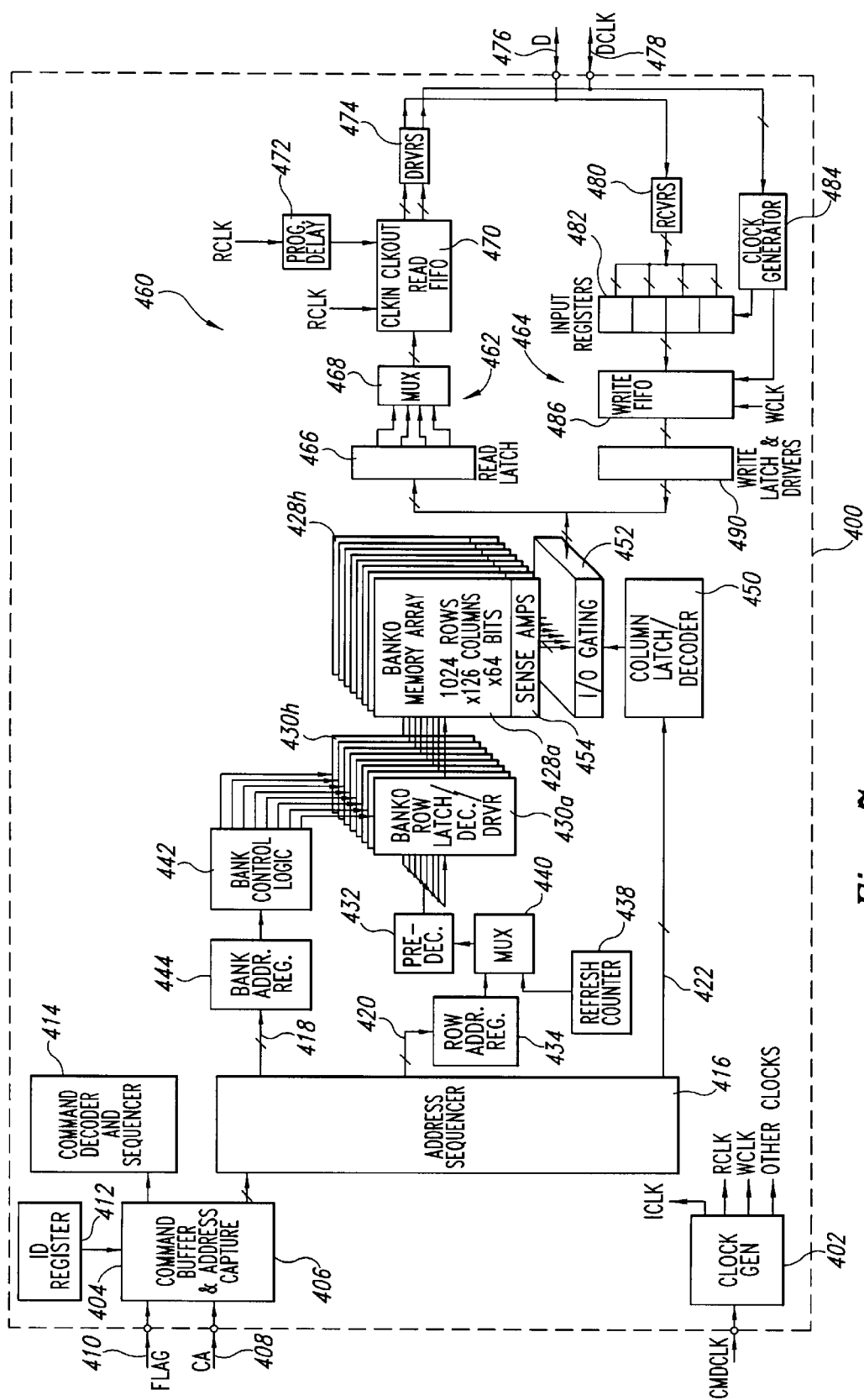
FIG. 7 is a block diagram of an embodiment of a packetized memory device that incorporates the output driver circuit shown in FIG. 3.

FIG. 7 is a block diagram of a memory circuit 400, which incorporates the output driver 200 of FIG. 3. The memory device 400 includes a clock generator circuit 402 that receives a command clock signal CMDCLK and generates an internal clock signal ICLK and a large number of other clock and timing signals to control the timing of various operations in the memory device 400. The memory device 400 also includes a command buffer 404 and an address capture circuit 406, which receive the internal clock signal ICLK, a command packet CA0–CA9 on a 10-bit command bus 408, and a FLAG signal on line 410. A memory controller (not shown) or other device normally transmits the command packet CA0–CA9 to the memory device 400 in synchronism with the command clock signal CMDCLK. As explained above, the command packet, which generally includes four 10-bit packet words, contains control and address information for each memory transfer. The FLAG signal identifies the start of a command packet, and it also signals the start of an initialization sequence. The command buffer 404 receives the command packet from the bus 408, and compares at least a portion of the command packet to identifying data from an ID register 412 to determine if the command packet is directed to the memory device 400 or some other memory device. If the command buffer 404 determines that the command packet is directed to the memory device 400, it then provides the command words to a command decoder and sequencer 414. The command decoder and sequencer 414 generates a large number of internal control signals to control the operation of the memory device 400 during a memory transfer.

The address capture circuit 406 also receives the command words from the command bus 408 and outputs a 20-bit address corresponding to the address information in the command packet. The address is provided to an address sequencer 416, which generates a corresponding 3-bit bank address on bus 418, a 10-bit row address on bus 420, and a 7-bit column address on bus 422. The column address and row address are processed by column and row address paths 424, 426 as will be described below.

One of the problems of conventional DRAMs is their relatively low speed resulting from the time required to precharge and equilibrate circuitry in the DRAM array. The packetized DRAM 400 shown in FIG. 7 largely avoids this problem by using a plurality of memory banks 428, in this case eight memory banks 428a–h. After a read from one bank 428a, the bank 428a can be precharged while the remaining banks 428b–h are being accessed. Each of the memory banks 428a–h receives a row address from a respective row latch/decoder/driver 430a–h. All of the row latch/decoder/drivers 430a–h receive the same row address from a predecoder 432 which, in turn, receives a row address from either a row address register 434, redundant row circuit 436, or a refresh counter 438, as determined by a multiplexer 440. However, only one of the row latch/decoder/drivers 430a–h is active at any one time, as determined by bank control logic 442 as a function of a bank address from a bank address register 444.

The column address on bus 422 is applied to a column latch/decoder 450, which supplies I/O gating signals to an I/O gating circuit 452. The I/O gating circuit 452 interfaces with columns of the memory banks 428a–h through sense amplifiers 454. Data is coupled to or from the memory banks 428a–h through the sense amplifiers 454 and the I/O gating circuit 452 and a data path subsystem 460, which includes a read data path 462 and a write data path 464. The read data path 462 includes a read latch 466 that stores data from the I/O gating circuit 452. In the memory device 400 shown in FIG. 7, 64 bits of data are stored in the read latch 466. The read latch then provides four 16-bit data words to an output multiplexer 468 that sequentially supplies each of the 16-bit data words to a read FIFO buffer 470. Successive 16-bit data words are clocked into the read FIFO buffer 470 by a clock signal DCLK generated by the clock generator 402. The 16-bit words are then clocked out of the read FIFO buffer 470 by a clock signal RCLK obtained by coupling the DCLK signal through a programmable delay circuit 472. The read FIFO buffer 470 sequentially applies the 16-bit words to a driver circuit 474 in synchronism with the RCLK signal. The driver circuit, in turn, applies the 16-bit data words to a data bus 476. The driver circuit 474 also applies the data clock signal DCLK to a clock line 478. The programmable delay circuit 472 is programmed during initialization of the memory device so that the DCLK signal has the optimum phase relative to DCLK signal for the DCLK signal to clock the read data into the memory controller (not shown), processor, or other device.

The write data path 464 includes a receiver buffer 480 coupled to the data bus 476. The receiver buffer 480 sequentially applies 16-bit words from the data bus 476 to four input registers 482, each of which is selectively enabled by a signal from a clock generator circuit 484. The clock generator circuit generates these enable signals responsive to the data clock DCLK, which, for write operations, is applied to the memory device 400 on line 478 from the memory controller, processor, or other device. As with the command clock signal CMDCLK and command packet CA0–CA9, the memory controller or other device (not shown) normally transmits the data to the memory device 400 in synchronism with the data clock signal DCLK. The clock generator 484 is programmed during initialization to adjust the timing of the clock signal applied to the input registers 482 relative to the DCLK signal so that the input registers can capture the write data at the proper times. Thus, the input registers 482 sequentially store four 16-bit data words and combine them into one 64-bit data word applied to a write FIFO buffer 486. The data are clocked into the write FIFO buffer 486 by a clock signal from the clock generator 484, and the data are clocked out of the write FIFO buffer 486 by an internal write clock WCLK signal. The WCLK signal is generated by the clock generator 402. The 64-bit write data are applied to a write latch and driver 490. The write latch and driver 490 applies the 64-bit write data to one of the memory banks 428a–h through the I/O gating circuit 452 and the sense amplifiers 454.

The various embodiments of the invention may be used in a variety of memory devices other than SLDRAMs including, but not limited to, asynchronous DRAM, synchronous DRAM, static RAM, and the like. Accordingly, the present invention is not limited by the specific form of memory device.

Figure 8:
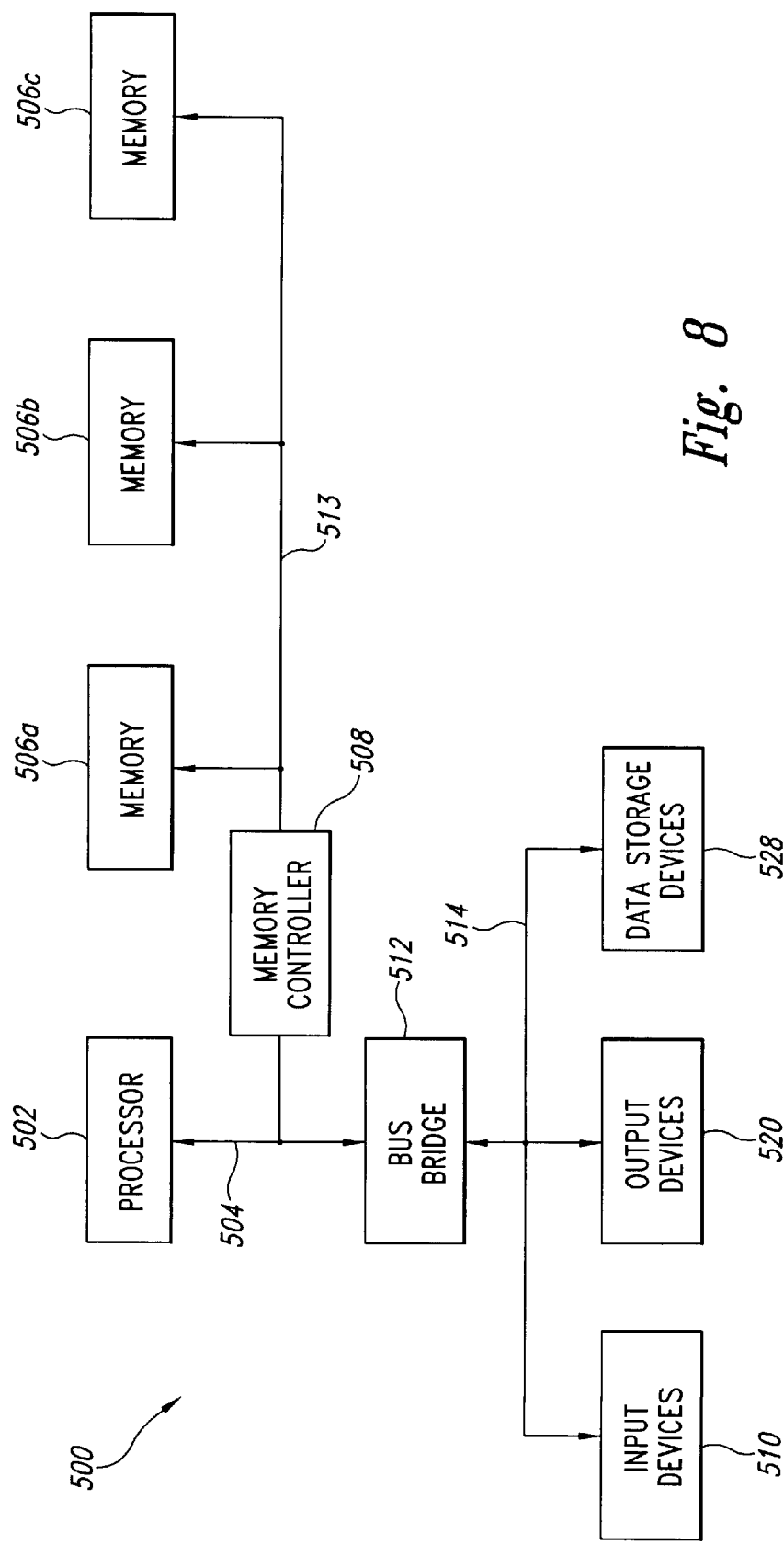
FIG. 8 is a block diagram of an embodiment of a computer system incorporating the memory circuit of FIG. 7.

Shown in FIG. 8 is an example of a computer system 500 using the output driver of FIG. 3 in each of a plurality of memory devices 506a–c. The computer system 500 includes a processor 502 having a processor bus 504 coupled through a memory controller 508 and system memory bus 513 to three memory devices 506a–c. The computer system 500 also includes one or more input devices 510, such as a keypad or a mouse, coupled to the processor 502 through a bus bridge 512 and an expansion bus 514, such as an industry standard architecture ("ISA") bus or a peripheral component interconnect ("PCI") bus. The input devices 510 allow an operator or an electronic device to input data to the computer system 500. One or more output devices 520 are coupled to the processor 502 to display or otherwise output data generated by the processor 502. The output devices 520 are coupled to the processor 502 through the expansion bus 514, bus bridge 512 and processor bus 504. Examples of output devices 520 include printers and a video display units. One or more data storage devices 528 are coupled to the processor 502 through the processor bus 504, bus bridge 512, and expansion bus 514 to store data in or retrieve data from storage media (not shown). Examples of storage devices 528 and storage media include fixed disk drives floppy disk drives, tape cassettes and compact-disk read-only memory drives.

In operation, the processor 502 sends a data transfer command via the processor bus 504 to the memory controller 508, which, in turn, communicates with the memory devices 506a–c via the system memory bus 513 by sending the memory devices 506a–c control and address information. Data is coupled between the memory controller 508 and the memory devices 506a–c through a data bus portion of the system memory bus 513. During a read operation, data is transferred from the memory devices 506a–c over the memory bus 513 to the memory controller 508 which, in turn, transfers the data over the processor bus 504 to the processor 502. The processor 502 transfers write data over the processor bus 504 to the memory controller 508 which, in turn, transfers the write data over the system memory bus 513 to the memory devices 506a–c. Although all the memory devices 506a–c are coupled to the same conductors of the system memory bus 513, only one memory device 506a–c at a time reads or writes data, thus avoiding bus contention on the memory bus 513.

The computer system 500 also includes a number of other components and signal lines that have been omitted from FIG. 8 in the interests of brevity.

It is to be understood that even though various embodiments and advantages of the present invention have been set forth in the foregoing description, the above disclosure is illustrative only, and changes may be made in detail, and yet remain within the broad principles of the invention. For example, the output driver 200 may be modified to select from more than only the two boot circuits 210, 212 to alternatively drive the pull-up node 216 (FIG. 3). Therefore, the present invention is to be limited only by the appended claims.

What is claimed is:

1. A method of providing an output data signal in response to receiving an input data signal, comprising:
   charging a pull-up node with a first boot circuit in response to receiving an input data signal having a first logic level following receipt of an input data signal having a second logic level;
   pre-charging a second boot circuit in preparation for charging the pull-up node; and
   charging the pull-up node with the second boot circuit in response to receiving a subsequent input data signal having the first logic level following receipt of an input data signal having the second logic level.

2. The method of claim 1, further comprising pre-charging the first boot circuit in preparation for charging the pull-up node during the second boot circuit is charging the pull-up node.

3. The method of claim 1, further comprising charging a pull-down node in response to receiving an input data signal having a second logic level.

4. The method of claim 3, further comprising discharging the pull-up node in response to receiving an input data signal having the second logic level.

5. The method of claim 1, further comprising isolating the first boot circuit while the second boot circuit is charging the pull-up node.

6. The method of claim 5 wherein the first boot circuit is isolated by a diode coupled to the pull-up node.

7. The method of claim 1 wherein charging the pull-up node with the first and second boot circuits comprises:
   pre-charging a supervoltage node;
   coupling the supervoltage node to the pull-up node; and
   boosting the charge on the supervoltage node.

8. The method of claim 7 wherein boosting the charge on the supervoltage node comprises increasing the charge on a first terminal of a capacitor having a second terminal coupled to the supervoltage node.

9. A method for charging a pull-up node for a data driver circuit in response to receiving an input data signal, comprising:
   selecting one from a plurality of pre-charging boot circuits to charge the pull-up node in response to receiving an input data signal having a first logic level following receipt of an input data signal having a second logic level; and selecting a second one from the plurality of pre-charging boot circuits to charge the pull-up node in response to receiving a subsequent input data signal having a first logic level following receipt of an input data signal having a second logic level.

10. The method of claim 9, further comprising pre-charging the selected one from the plurality of pre-charging boot circuits while the selected second one from the plurality of pre-charging boot circuits is charging the pull-up node.

11. The method of claim 9, further comprising discharging the pull-up node in response to receiving an input data signal having the second logic level.

12. The method of claim 9, further comprising isolating the selected one from the plurality of pre-charging boot circuits while the selected second one from the plurality of pre-charging boot circuits is charging the pull-up node.

13. The method of claim 12 wherein the selected one from the plurality of pre-charging boot circuits is isolated by a diode coupled to the pull-up node.

14. A method of generating output data signals according to input data signals, the method comprising:
   alternatively charging a pull-up node with a first and second boot circuit in response to receiving an input data signal having a first logic level following receipt of input data signal having a second logic level; and
   coupling an output terminal to a first reference voltage through a first switch activated in response to charging the pull-up node.

15. The method according to claim 14, further comprising discharging the pull-up node when the input data signal has the second logic level.

16. The method according to claim 14, further comprising:
   receiving a data clock signal having a first and second edge;
   receiving the input data signal at a first input terminal in response to the first edge of the data clock signal; and
   receiving the input data signal at a second input terminal in response to the second edge of the data clock signal.

17. The method according to claim 14 wherein alternatively charging the pull-up node comprises:
   selecting the first boot circuit to charge the pull-up node in response to receiving an input data signal having the first logic level following receipt of an input data signal having a second logic level; and
   selecting the second boot circuit to charge the pull-up node in response to subsequently receiving an input data signal having the first logic level following receipt of an input data signal having a second logic level.

18. The method according to claim 17, wherein alternatively charging the pull-up node further comprises:
   decoupling the second boot circuit from the pull-up node in response to selecting the first boot circuit; and
   decoupling the first boot circuit from the pull-up node in response to selecting the second boot circuit.

19. The method according to claim 14 wherein alternatively charging the pull-tip node comprises:
   pre-charging a supervoltage node;
   coupling the supervoltage node to the pull-up node; and
   boosting the charge on the supervoltage node by increasing the charge on a first terminal of a capacitor having a second terminal coupled to the supervoltage node.

20. The method according to claim 14 wherein alternatively charging the pull-up node further comprises disabling a supply used for charging the pull-down node.

* * * * *

UNITED STATES PATENT AND TRADEMARK OFFICE
CERTIFICATE OF CORRECTION

PATENT NO. : 6,330,196 B1  Page 1 of 1
DATED : December 11, 2001
INVENTOR(S) : Brendan N. Protzman It is certified that error appears in the above-identified patent and that said Letters Patent is hereby corrected as shown below:

<u>Column 12,</u>
Line 57, reads "pull-tip" should read -- pull-up --

Signed and Sealed this

Eleventh Day of June, 2002

*Attest:*

*Attesting Officer*

JAMES E. ROGAN
*Director of the United States Patent and Trademark Office*